United States Patent
Chen

(10) Patent No.: US 11,870,400 B2
(45) Date of Patent: Jan. 9, 2024

(54) CLASS-D AMPLIFYING SYSTEM AND CLASS-D AMPLIFIER CIRCUIT

(71) Applicant: Richtek Technology Corporation, Zhubei (TW)

(72) Inventor: Yi-Kuang Chen, Taichung (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 25 days.

(21) Appl. No.: 17/676,594

(22) Filed: Feb. 21, 2022

(65) Prior Publication Data

US 2022/0294396 A1 Sep. 15, 2022

(30) Foreign Application Priority Data

Mar. 15, 2021 (TW) ................................ 110109061

(51) Int. Cl.
H03F 1/26 (2006.01)
H03F 3/217 (2006.01)
H03F 1/02 (2006.01)

(52) U.S. Cl.
CPC ............ *H03F 1/26* (2013.01); *H03F 1/0216* (2013.01); *H03F 3/217* (2013.01); *H03F 2200/372* (2013.01)

(58) Field of Classification Search
CPC .......... H03F 1/26; H03F 1/0216; H03F 3/217; H03F 2200/372; H03F 3/2173; G05F 3/262; H03M 1/742

USPC ....................................... 330/10, 251, 207 A
See application file for complete search history.

(56) References Cited

U.S. PATENT DOCUMENTS

| 2016/0182998 | A1 | 6/2016 | Galal et al. |
| 2018/0062583 | A1 | 3/2018 | Zhao et al. |
| 2022/0255516 | A1* | 8/2022 | Lin .................... H03F 3/45475 |

FOREIGN PATENT DOCUMENTS

CN 109104194 A 12/2018

* cited by examiner

*Primary Examiner* — Hieu P Nguyen
(74) *Attorney, Agent, or Firm* — Tung & Associates

(57) ABSTRACT

A class-D amplifying system includes: a first digital-to-analog converter (DAC), a class-D amplifier circuit and a second DAC. The first DAC generates an analog input signal according to a digital input signal. The class-D amplifier circuit generates an output signal according to the analog input signal in a pulse width modulation (PWM) manner. The second DAC generates a common mode (CM) adjustment current for adjusting a CM voltage of the analog input signal according to one or more of the following parameters: (1) the CM voltage of the analog input signal; and/or (2) a driving power. A power stage circuit of the class-D amplifier circuit is powered by the driving power. The second DAC determines which parameter the CM adjustment current is correlated to according to: (A) A level state of the output signal; and/or (B) A level state of a PWM signal of the class-D amplifier circuit.

36 Claims, 8 Drawing Sheets

| Level State of Output Signal | Ica |
|---|---|
| Voutp = Voutn = 1 (PVDD) | (Viic−PVDD)/Rf |
| Voutp ≠ Voutn | (Viic−PVDD/2)/Rf |
| Voutp = Voutn = 0 | Viic/Rf |

Fig. 6

| Level State of Output Signal | Ica |
|---|---|
| Voutp = Voutn = 1 (PVDD) | (Viic+ΔV−PVDD)/Rf |
| Voutp ≠ Voutn | (Viic−PVDD/2)/Rf |
| Voutp = Voutn = 0 | (Viic+ΔV)/Rf |

Fig. 7

| Level State of Output Signal and Level State of PWM Signal | | Ica |
|---|---|---|
| Opwmp = Opwmn = 1 (VDD) | Voutp = Voutn = 1 (PVDD) | (Viic+ΔV−PVDD)/Rf |
| | Voutp ≠ Voutn | (Viic+K1*ΔV−PVDD/2)/Rf |
| | Voutp = Voutn = 0 | (Viic+K2*ΔV)/Rf |
| Opwmp ≠ Opwmn | Voutp = Voutn = 1 (PVDD) | (Viic+K3*ΔV−PVDD)/Rf |
| | Voutp ≠ Voutn | (Viic−PVDD/2)/Rf |
| | Voutp = Voutn = 0 | (Viic+K4*ΔV)/Rf |
| Opwmp = Opwmn = 0 | Voutp = Voutn = 1 (PVDD) | (Viic+K5*ΔV−PVDD)/Rf |
| | Voutp ≠ Voutn | (Viic+K6*ΔV−PVDD/2)/Rf |
| | Voutp = Voutn = 0 | (Viic+ΔV)/Rf |

Fig. 8

CLASS-D AMPLIFYING SYSTEM AND CLASS-D AMPLIFIER CIRCUIT

CROSS REFERENCE

The present invention claims priority to claims priority to TW 110109061 filed on Mar. 15, 2021.

BACKGROUND OF THE INVENTION

Field of Invention

The present invention relates to a class-D amplifying system; particularly, it relates to such class-D amplifying system capable of adjusting a common mode voltage by a common mode current type digital-to-analog converter (DAC). The present invention also relates to a class-D amplifier circuit capable of adjusting a CM voltage by a CM current type DAC.

Description of Related Art

Please refer to FIG. 1, which shows a schematic diagram of a conventional class-D amplifying system. As shown in FIG. 1, this conventional class-D amplifying system 10 includes: a voltage type digital-to-analog converter (DAC) 101, a low-pass filter 102 and a class-D amplifier circuit 103. The class-D amplifier circuit 103 includes an amplifier 1031. This conventional class-D amplifying system 10 employs the amplifier 1031 and the low-pass filter 102 to control a CM voltage of a positive sub-signal Viip and a negative sub-signal Viin of an analog input signal Vii at an analog input node Vii in the class-D amplifier circuit 103. However, this prior art shown in FIG. 1 has a drawback that the voltage type DAC 101, the low-pass filter 102 and the class-D amplifier circuit 103 will generate noises.

In view of the above, to overcome the drawback of the prior art, the present invention proposes an innovative class-D amplifying system.

SUMMARY OF THE INVENTION

From one perspective, the present invention provides a class-D amplifying system, comprising: an input current type digital-to-analog converter (DAC), which is configured to operably convert a digital input signal, so as to generate an analog input signal at an analog input node; a class-D amplifier circuit, which is coupled to the input current type DAC, wherein the class-D amplifier circuit includes: a pulse width modulator, which is configured to operably generate a pulse width modulation (PWM) signal according to the analog input signal; an H-bridge (full-bridge) power stage circuit, which is configured to operably generate an output signal according to the PWM signal, wherein the H-bridge power stage circuit is powered by a driving power supply; and a feedback device, which is configured to operably feedback the output signal to the analog input node; and a common mode (CM) current type digital-to-analog converter (DAC), which is coupled to the analog input node and which is configured to operably generate a CM adjustment current, wherein the CM adjustment current is correlated with one of the following parameters: (1) a CM voltage of the analog input signal; (2) the driving power supply; or (3) the CM voltage of the analog input signal and the driving power supply; wherein the CM current type DAC is configured to operably determine which of the parameters (1)-(3) that the CM adjustment current is to be correlated with according to one of the following states: (A) a level state of the output signal; (B) a level state of the PWM signal; or (C) the level state of the output signal and the level state of the PWM signal.

In one embodiment, the class-D amplifier circuit further includes: a first amplifier, which is coupled between the pulse width modulator and the analog input node and which is configured to operably buffer and amplify the analog input signal.

In one embodiment, the class-D amplifier circuit further includes: a second amplifier, which is coupled between the analog input node and an input end of the first amplifier, wherein the second amplifier is configured to operably control the CM voltage of the analog input signal by pseudo-grounding.

In one embodiment, in a case when the CM adjustment current is correlated with the parameter (1) or the parameter (3), the CM adjustment current is positively correlated with the analog input signal.

In one embodiment, in a case when the state (A) or the state (C) is in presence, when the output signal is at a high level state, the CM adjustment current is negatively correlated with the driving power supply.

In one embodiment, the output signal includes a signal pair including a positive sub-signal and a negative sub-signal, wherein in a case when the state (A) or the state (C) is in presence, when a level state of the positive sub-signal of the output signal is different from a level state of the negative sub-signal of the output signal, the CM adjustment current is negatively correlated with ½-fold of the driving power supply.

In one embodiment, in an adaptive voltage position mode, the CM adjustment current is further positively correlated with a predetermined voltage difference, wherein the predetermined voltage difference is correlated with an amplitude of the output signal, a slope of the output signal and a resistance of the feedback device, wherein in the adaptive voltage position mode, a target value of the CM voltage of the analog input signal is synchronous with and correlated with a CM voltage of the output signal.

In one embodiment, the output signal includes a signal pair including a positive sub-signal and a negative sub-signal, wherein in the adaptive voltage position mode and in a case when the state (A) is in presence, when a level state of the positive sub-signal of the output signal is the same as a level state of the negative sub-signal of the output signal, the CM adjustment current is further positively correlated with the predetermined voltage difference.

In one embodiment, the output signal includes a signal pair including a positive sub-signal and a negative sub-signal and the PWM signal includes a signal pair including a positive sub-signal and a negative sub-signal, wherein in the adaptive voltage position mode and in a rapid response mode, in a case when the state (C) is in presence, when a level state of the positive sub-signal of the output signal is different from a level state of the positive sub-signal of the PWM signal and/or when a level state of the negative sub-signal of the output signal is different from a level state of the negative sub-signal of the PWM signal, the CM adjustment current is further positively correlated with a product of a predetermined voltage difference multiplied by a predetermined coefficient.

In one embodiment, the predetermined coefficient is a real number ranging between 0 and 1.

In one embodiment, the CM adjustment current is negatively correlated with a resistance of the feedback device.

In one embodiment, the CM current type DAC includes: a decoder, which is configured to operably execute a decoding operation according to the PWM signal and a clamped output signal, so as to generate a switch control signal, wherein the clamped output signal is obtained by clamping the output signal; and a current determination circuit having a plurality of intermediate current sources and a plurality of adjustment switches, wherein the switch control signal is configured to operably control the plurality of adjustment switches, so as to switch the plurality of intermediate current sources, thus generating the CM adjustment current.

In one embodiment, the CM current type DAC further includes: a voltage clamper, which is configured to operably clamp the output signal, to generate the clamped output signal.

In one embodiment, the voltage clamper includes: a clamp transistor, which is configured to operably generate an intermediate signal according to the output signal and a signal power supply; and a buffer, which is configured to operably generate the clamped output signal according to the intermediate signal, wherein the signal power supply provides power to the buffer.

In one embodiment, the current determination circuit includes: at least one voltage-to-current conversion circuit, which is configured to operably convert the CM voltage of the analog input signal or convert the driving power to at least one reference current; and a plurality of current mirrors, which is configured to operably generate the plurality of intermediate current sources according to the at least one reference current.

In one embodiment, in a case when the output signal is zero, the CM current type DAC is disabled, so as to reduce noise.

In one embodiment, in a case when the state (C) is in presence, the CM current type DAC is configured to operably determine the parameters (1)-(3) which are correlated with the CM adjustment current according to a delay relationship between the output signal and the PWM signal.

From another perspective, the present invention provides a class-D amplifier circuit, which is configured to operably receive an analog input signal from an analog input node, and to operably convert the analog input signal, thus generating an output signal; the class-D amplifying system comprising: a pulse width modulator, which is configured to operably generate a pulse width modulation (PWM) signal according to the analog input signal; an H-bridge (full-bridge) power stage circuit, which is configured to operably generate an output signal according to the PWM signal, wherein the H-bridge power stage circuit is powered by a driving power supply; a feedback device, which is configured to operably feedback the output signal to the analog input node; and a common mode (CM) current type digital-to-analog converter (DAC), which is coupled to the analog input node and which is configured to operably generate a CM adjustment current, wherein the CM adjustment current is correlated with one of the following parameters: (1) a CM voltage of the analog input signal; (2) the driving power supply; or (3) the CM voltage of the analog input signal and the driving power supply; wherein the CM current type DAC is configured to operably determine the parameters (1)-(3) which are correlated with the CM adjustment current according to one of the following states: (A) a level state of the output signal; (B) a level state of the PWM signal; or (C) the level state of the output signal and the level state of the PWM signal.

Advantages of the present invention include: that by employing an input current type DAC, the present invention can omit the use of a second amplifier, whereby noises are reduced; and that in a case when an output signal is zero, the CM current type DAC of the present invention can be disabled to further reduce noises.

Other advantages of the present invention include: that the common mode current type DAC of the present invention can enhance the response speed of the CM voltage of an analog input signal in a non-linear manner, to compensate the insufficiency of bandwidth or slew rate of a linear amplifier circuit (for example but not limited to a first amplifier and a second amplifier) of a class-D amplifier circuit; and that the present invention can lower the requirements of slew rate, bandwidth or current for the second amplifier.

The objectives, technical details, features, and effects of the present invention will be better understood with regard to the detailed description of the embodiments below, with reference to the attached drawings.

BRIEF DESCRIPTION OF THE DRAWINGS

FIG. 6 shows a table depicting signals of a CM current type DAC according to an embodiment of the present invention.

FIG. 7 shows a table depicting signals of a CM current type DAC according to another embodiment of the present invention.

FIG. 8 shows a table depicting signals of a CM current type DAC according to yet another embodiment of the present invention.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
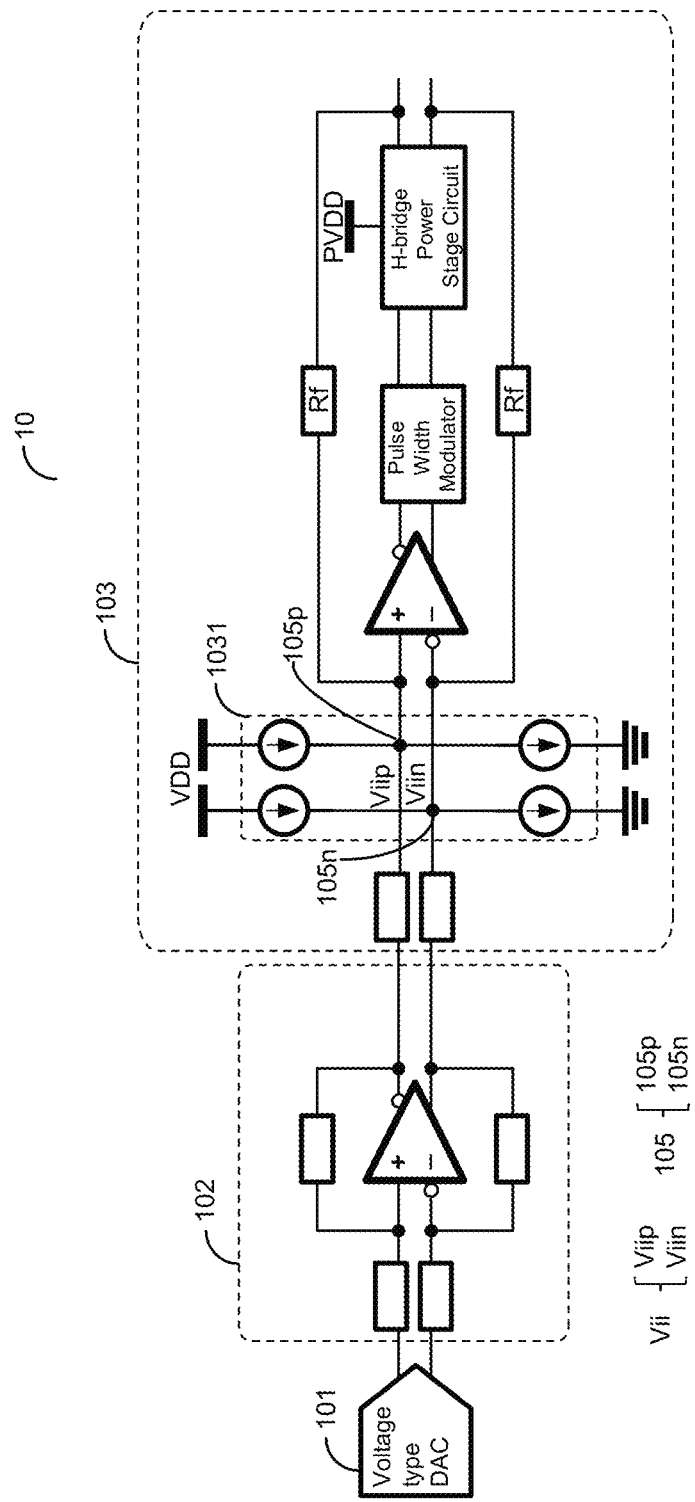
FIG. 1 shows a schematic diagram of a conventional class-D amplifying system.
Figure 2:
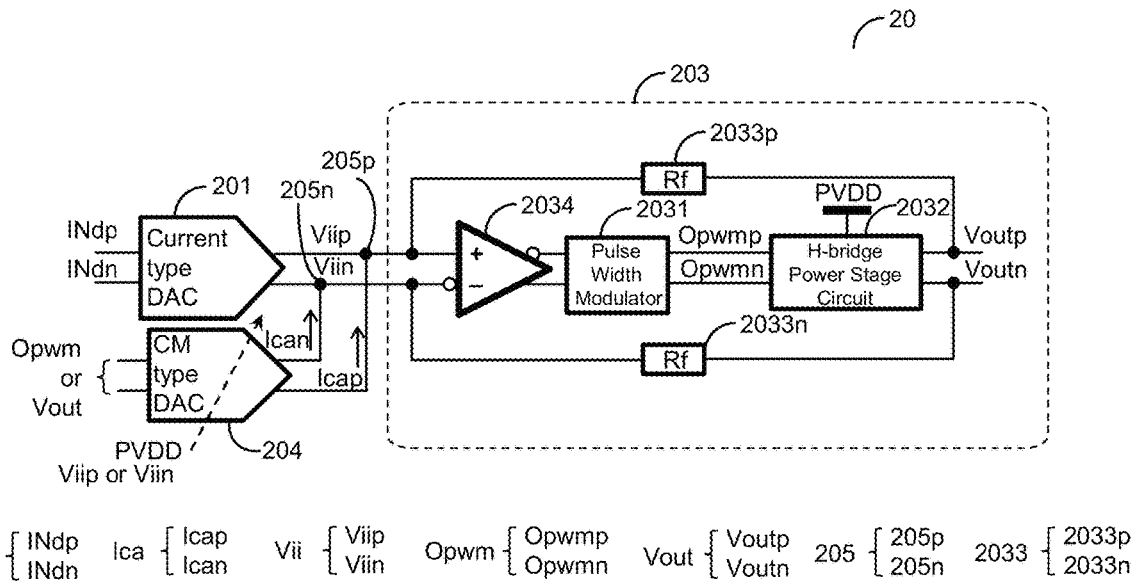
FIG. 2 shows a schematic circuit diagram of a class-D amplifying system according to an embodiment of the present invention.

Please refer to FIG. 2, which shows a schematic circuit diagram of a class-D amplifying system (i.e., class-D amplifying system 20) according to an embodiment of the present invention. As shown in FIG. 2, the class-D amplifying system 20 of the present invention comprises: an input current type digital-to-analog converter (DAC) 201, a class-D amplifier circuit 203 and a common mode current type digital-to-analog converter (DAC) 204. The input current type DAC 201 is configured to operably convert a digital input signal INd, so as to generate an analog input signal Vii at an analog input node 205. The class-D amplifier circuit 203 is coupled to the input current type DAC 201. Please refer to FIG. 2. The class-D amplifier circuit 203 includes: a pulse width modulator 2031, an H-bridge (full-bridge) power stage circuit 2032, a feedback device 2033 and a first amplifier 2034. An input end of the pulse width modulator 2031 is coupled to an output end of the input current type DAC 201. The pulse width modulator 2031 is configured to operably generate a pulse width modulation (PWM) signal Opwm according to the analog input signal Vii. An input end of the H-bridge power stage circuit 2032 is coupled to an output end of the pulse width modulator 2031. The H-bridge power stage circuit 2032 is configured to operably generate an output signal Vout according to the PWM signal Opwm, wherein the H-bridge power stage circuit 2032 is powered by a driving power supply PVDD. The feedback device 2033 is coupled between an output end of the H-bridge power stage circuit 2032 and the first amplifier 2034. The feedback device 2033 is configured to operably feedback the output signal Vout to the analog input node 205. In one embodiment, the feedback device 2033 has a resistance equal to Rf. The first amplifier 2034 is coupled between the pulse width modulator 2031 and the analog input node 205, and the first amplifier 2034 is configured to operably buffer and amplify the analog input signal Vii.

As shown in FIG. 2, the CM current type DAC 204 is coupled to the analog input node 205 and the CM current type DAC 204 is configured to operably generate a CM adjustment current Ica. Because the signals within the class-D amplifying system 20 are fully differential signals, each of the digital input signal INd, the analog input signal Vii, the PWM signal Opwm, the output signal Vout and the CM adjustment current Ica includes a signal pair, wherein each signal pair of the digital input signal INd, the analog input signal Vii, the PWM signal Opwm, the output signal Vout and the CM adjustment current Ica includes a positive sub-signal and a negative sub-signal. To be more specific, the digital input signal INd is a signal pair including a positive sub-signal INdp and a negative sub-signal INdn; the analog input signal Vii is a signal pair including a positive sub-signal Viip and a negative sub-signal Viin; the PWM signal Opwm is a signal pair including a positive sub-signal Opwmp and a negative sub-signal Opwmn; the output signal Vout is a signal pair including a positive sub-signal Voutp and a negative sub-signal Voutn; the CM adjustment current Ica is a signal pair including a positive sub-signal Icap and a negative sub-signal Ican. In one embodiment, the positive sub-signal Icap of the CM adjustment current Ica is equal to the negative sub-signal Ican of the CM adjustment current Ica. likely, the analog input node 205 is a node pair including a positive sub-node 205p and a negative sub-node 205n. The feedback device 2033 is a device pair including a positive-phase feedback device 2033p and a negative-phase feedback device 2033n.

Figure 3:
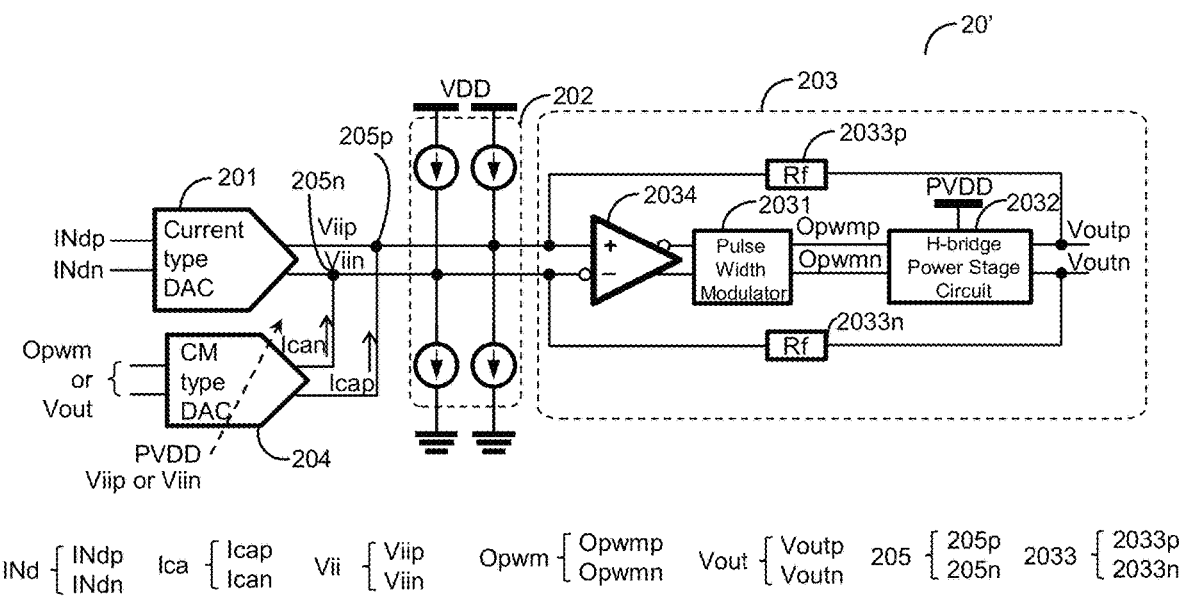
FIG. 3 shows a schematic circuit diagram of a class-D amplifying system according to another embodiment of the present invention.

Please refer to FIG. 3, which shows a schematic circuit diagram of a class-D amplifying system according to another embodiment of the present invention. This embodiment shown in FIG. 3 is different from the embodiment shown in FIG. 2 in that: the class-D amplifying system 20 of this embodiment further includes a second amplifier 202, which is coupled between the analog input node 205 and an input end of the first amplifier 2034. The second amplifier 202 is configured to operably control a CM voltage Viic of the analog input signal Vii by pseudo-grounding. The input current type DAC 201, the class-D amplifier circuit 203 and the CM current type DAC 204 of this embodiment shown in FIG. 3 are similar to the input current type DAC 201, the class-D amplifier circuit 203 and the CM current type DAC 204 of the embodiment shown in FIG. 2, so the details thereof are not repeatedly explained here.

In one embodiment, the class-D amplifying system is coupled to an upstream digital signal processing circuit which generates the digital input signal INd, and the upstream digital signal processing circuit provides a filtering operation in digital manner. In another embodiment, the filtering operation can be achieved by configuring the resistance the feedback device 2033.

Figure 4:
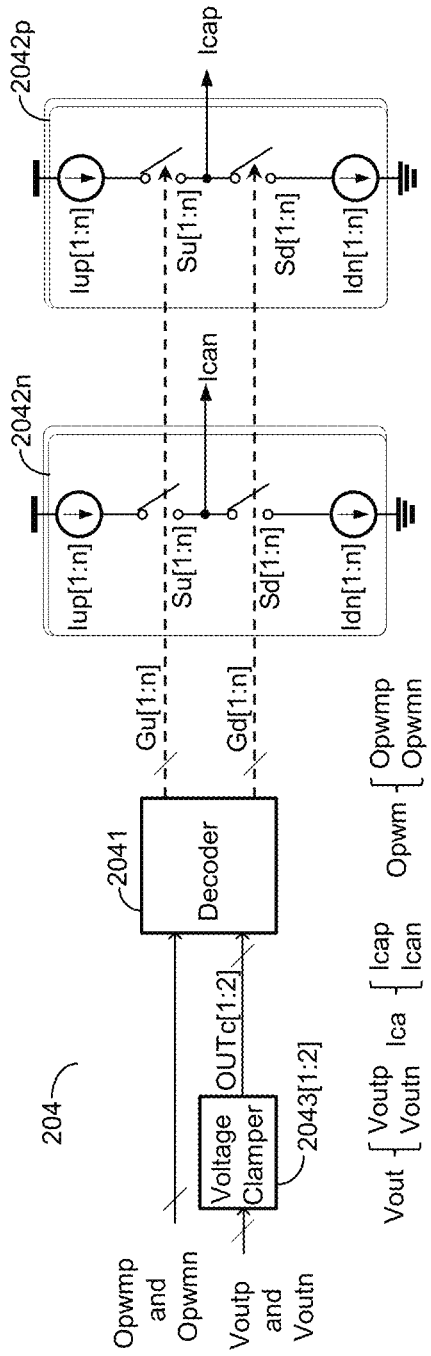
FIG. 4 shows a schematic circuit diagram of a CM current type DAC for use in a class-D amplifying system according to an embodiment of the present invention.

Please refer to FIG. 4, which shows a schematic circuit diagram of a common mode current type digital-to-analog converter (i.e., CM DAC 204) according to an embodiment of the present invention. As shown in FIG. 4, in one embodiment, the CM DAC 204 includes: a decoder 2041, a current determination circuit 2042n, a current determination circuit 2042p and a voltage clamper 2043[1:2].

The decoder 2041 is configured to operably execute an decoding operation according to the PWM signal Opwm and/or the output signal Vout, so as to generate a switch control signal Gu[1:n] and a switch control signal Gd[1:n], wherein n is an integer greater than or equal to one.

In one embodiment, each of the current determination circuit 2042n and the current determination circuit 2042p includes: intermediate current sources Iup[1:n] and Idn[1:n] and adjustment switches Su[1:n] and Sd[1:n]. The switch control signal Gu[1:n] and the switch control signal Gd[1:n] are configured to operably control the adjustment switch Su[1:n] and the adjustment switch Sd[1:n], respectively, so as to switch the intermediate current source Iup[1:n] and intermediate current source Idn[1:n], respectively, to thereby generate the CM adjustment current Ica. In one embodiment, in a case when the output signal Vout is zero, the CM current type DAC 204 is disabled, so as to reduce noise. That is, under such circumstance, the adjustment switch Su[1:n] and the adjustment switch Sd[1:n] are both OFF, whereby the CM adjustment current Ica is zero.

In one embodiment, in a case when a power supply level of the H-bridge power stage circuit 2032 is different from an internal power supply level of a signal processing circuit (which is, e.g., the CM current type DAC 204), a voltage clamper 2043[1:2] can be disposed at an upstream of the CM current type DAC 204. Under such configuration, such voltage clamper 2043[1:2] is configured to operably clamp the output signal Vout, to generate a clamped output signal OUTc[1:2], so that the output signal Vout is prevented from being too high to damage the signal processing circuit inside the CM current type DAC 204.

Figure 5:
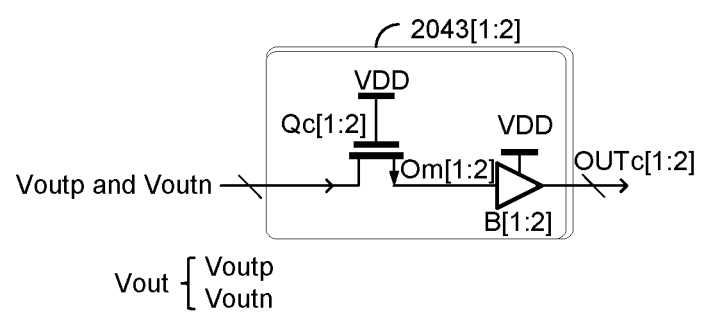
FIG. 5 shows a schematic circuit diagram of a voltage clamper for use in a CM current type DAC of a class-D amplifying system according to an embodiment of the present invention.

Please refer to FIG. 5, which shows a schematic circuit diagram of a voltage clamper according to an embodiment of the present invention. As shown in FIG. 5, the voltage clamper 2043 [1:2] includes: a clamp transistor Qc[1:2] and a buffer B[1:2]. A source of the clamp transistor Qc[1:2] is coupled to an input end of the buffer B[1:2]; a drain of the clamp transistor Qc[1:2] receives the output signals Voutp and Voutn; a gate of the clamp transistor Qc[1:2] is coupled to a signal power supply VDD. The clamp transistor Qc[1:2] is configured to operably generate an intermediate signal Om[1:2] according to the output signal Vout and a signal power supply VDD. The buffer B[1:2] is configured to operably generate the clamped output signal OUTc[1:2]

according to the intermediate signal Om[1:2]. In one embodiment, the signal power supply VDD provides power to the buffer B[1:2].

In one embodiment, the CM adjustment current Ica is correlated with one of the following parameters: (1) the CM voltage Viic of the analog input signal Vii; (2) the driving power PVDD; or (3) the CM voltage Viic of the analog input signal Vii and the driving power supply PVDD.

In one embodiment, the CM current type DAC 204 is configured to operably determine which of the parameters (1)-(3) that the CM adjustment current Ica is to be correlated with according to one of the following states: (A) the level state of the output signal Vout (to be more specific, the level state of the positive sub-signal Voutp of the output signal Vout and the level state of the negative sub-signal Voutn of the output signal Vout); (B) the level state of the PWM signal Opwm (to be more specific, the level state of the positive sub-signal Opwmp of the PWM signal Opwm and the level state of the negative sub-signal Opwmn of the PWM signal Opwm); or (C) the level state of the output signal Vout and the level state of the PWM signal Opwm.

Please refer to FIG. 6 to FIG. 8, which shows tables depicting signals within a CM current type DAC according to embodiments of the present invention, respectively. To be more specific, FIG. 6 shows a situation wherein a CM current type converter DAC operates in a general mode. FIG. 7 shows a situation wherein a CM current type converter DAC operates in an adaptive voltage position (AVP) mode. FIG. 8 shows a situation wherein a CM current type converter DAC operates in an AVP mode having quick response (QR).

Figure 9:
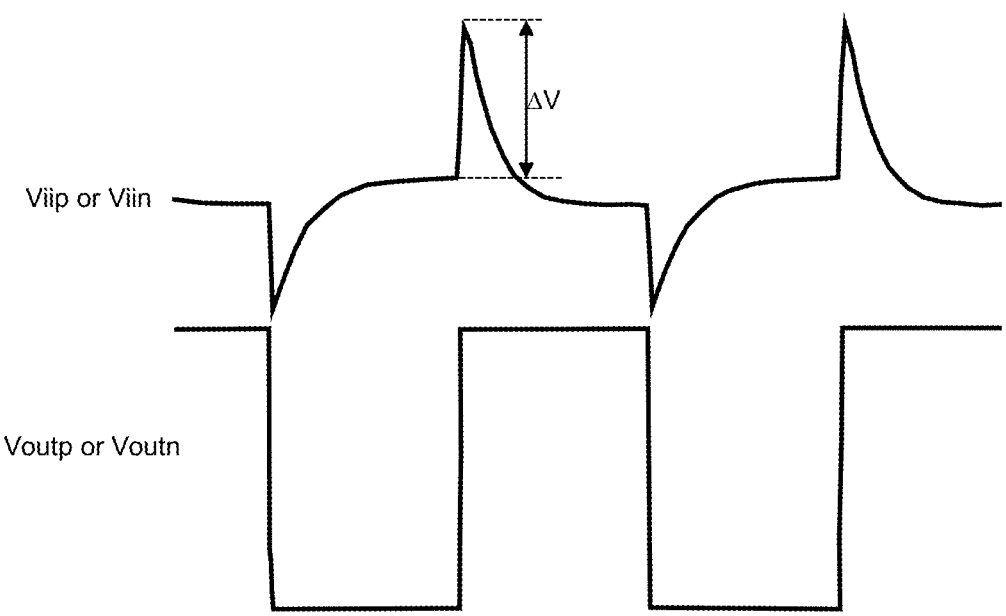
FIG. 9 illustrates a signal waveform diagram corresponding to the table of FIG. 6.
Figure 10:
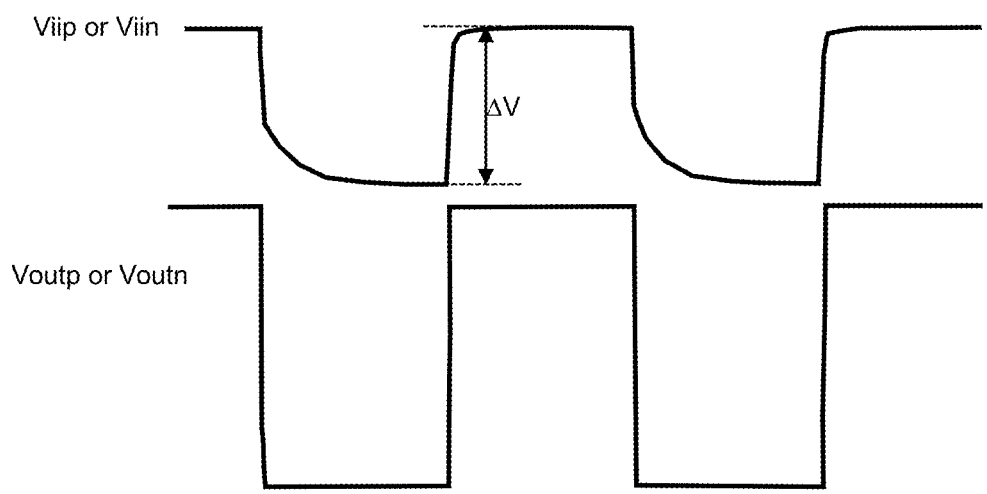
FIG. 10 illustrates a signal waveform diagram corresponding to the table of FIG. 7.
Figure 11:
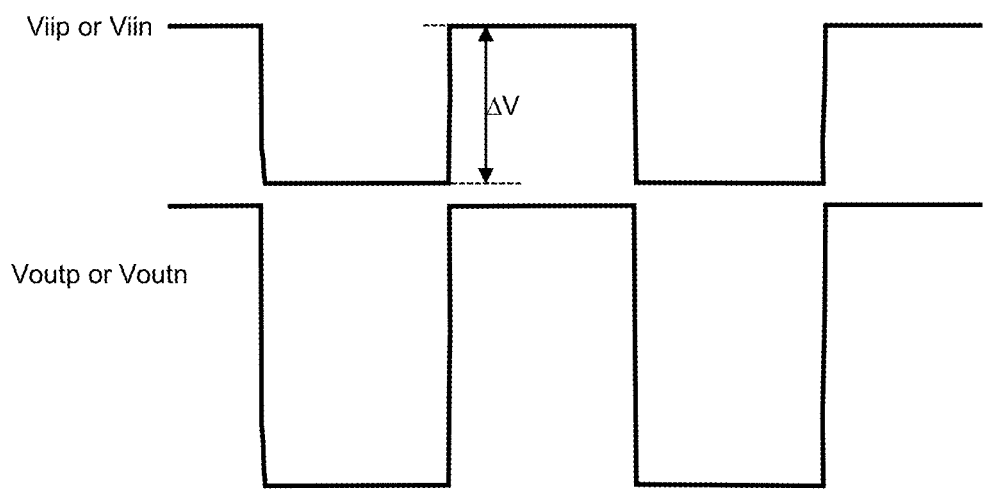
FIG. 11 illustrates a signal waveform diagram corresponding to the table of FIG. 8.

Please refer to FIG. 9 to FIG. 11, which illustrates signal waveform diagrams corresponding to the tables of FIG. 6 to FIG. 8, respectively. Please refer to FIG. 6 in conjugation with FIG. 9. In a general mode, the CM current type DAC 204 can determine which of the parameters (1)-(3) that the CM adjustment current Ica is to be correlated with according to the level state of the output signal Vout.

As shown in FIG. 6, in one embodiment, in a general mode, the CM adjustment current Ica is positively correlated with the CM voltage Viic of the analog input signal Vii.

As shown in FIG. 6, in one embodiment, the CM adjustment current Ica is negatively correlated with the driving power supply PVDD. It is worthwhile mentioning that, in this embodiment, the CM adjustment current Ica flows in the current directions as shown in FIG. 2 to FIG. 4 and FIG. 12.

To elaborate in more detail, as shown in FIG. 6, in one embodiment, in a general mode, when the level state of the positive sub-signal Voutp of the output signal Vout and the level state of the negative sub-signal Voutn of the output signal Vout are both at the high level state (as shown in FIG. 6, the high level state is denoted as "1"), the CM adjustment current Ica is negatively correlated with the driving power supply PVDD. On the other hand, when the level state of the positive sub-signal Voutp of the output signal Vout is different from the level state of the negative sub-signal Voutn of the output signal Vout (e.g., as shown in FIG. 6, one of the positive sub-signal Voutp and the negative sub-signal Voutn is at the high level state, while, the other one of the positive sub-signal Voutp and the negative sub-signal Voutn is at the low level state), the CM adjustment current Ica is negatively correlated with ½-fold of the driving power supply PVDD. In one embodiment, when the level state of the positive sub-signal Voutp of the output signal Vout and the level state of the negative sub-signal Voutn of the output signal Vout are both at the low level state (as shown in FIG. 6, the low level state is denoted as "0"), the CM adjustment current Ica is not correlated with the driving power supply PVDD.

As shown in FIG. 6, in one embodiment, the CM adjustment current Ica is negatively correlated with a resistance Rfof the feedback device 2033.

In another embodiment, "the level state of the output signal Vout" in FIG. 6 can be replaced by "the level state of the PWM signal Opwm", so that the CM current type DAC 204 can determine which of the parameters (1)-(3) that the CM adjustment current Ica is to be correlated with according to "the level state of the PWM signal Opwm". That is, in one embodiment, the relationship between "the level state of the PWM signal Opwm" and the parameters correlated with the CM adjustment current Ica corresponds to the relationship between "the level state of the output signal Vout" and the parameters correlated with the CM adjustment current Ica.

Please refer to FIG. 7 in conjugation with FIG. 10. This embodiment shown in FIG. 7 and FIG. 10 is similar to the embodiment shown in FIG. 6 and FIG. 9, but is different in that: in an adaptive voltage position (AVP) mode, the CM adjustment current Ica is further positively correlated with a predetermined voltage difference ΔV. In one embodiment, the predetermined voltage difference ΔV is correlated with an amplitude of the output signal Vout, a slope of the output signal Vout and a resistance Rf of the feedback device 2033. In one embodiment, in an AVP mode, a target value of the CM voltage Viic of the analog input signal Vii is synchronous with and correlated with a CM voltage (as shown in FIG. 10) of the output signal Vout. That is, when the CM voltage of the output signal Vout changes, the target value of the CM voltage Viic can be adaptively adjusted according to the CM voltage of the output signal Vout, which is the "adaptive voltage position (AVP)". Thus, this embodiment can reduce the ripple of the CM voltage Viic of the analog input signal Vii, and also can reduce the requirements of slew rate, bandwidth or current for the second amplifier 202. As shown in FIG. 10, a waveform indicative of the analog input signal Vii (i.e., Viip or Viin) approximately resembles a waveform indicative of the output signal Vout (i.e., Voutp or Voutn). ("Approximately resembles" refers to resemblance between the waveforms, not resemblance of amplitudes of the waveforms.)

As shown in FIG. 7, in one specific embodiment, in an AVP mode, when the level state of the positive sub-signal Voutp of the output signal Vout is the same as the level state of the negative sub-signal Voutn of the output signal Vout (e.g., as shown in FIG. 7, both are at the high level state or both are at the low level state), the CM adjustment current Ica is further positively correlated with the predetermined voltage difference ΔV.

Please refer to FIG. 8 in conjugation with FIG. 11. This embodiment shown in FIG. 8 and FIG. 11 is similar to the embodiment shown in FIG. 7 and FIG. 10, but is different in that: As shown in FIG. 8, in one embodiment, in an AVP mode having quick response (QR), the CM current type DAC 204 is configured to operably determine which of the parameters (1)-(3) that the CM adjustment current Ica is to be correlated with according to both the level state of the output signal Vout and the level state of the PWM signal Opwm. Under such situation, the CM adjustment current Ica is correlated with the predetermined voltage difference ΔV in a more delicate way. As shown in FIG. 11, the waveform indicative of the analog input signal Vii (i.e., Viip or Viin) now much more resembles the waveform indicative of the output signal Vout (i.e., Voutp or Voutn). In fact, according to for example the embodiment shown in FIG. 3, the PWM signal Opwm is an upstream signal of the output signal Vout.

Therefore, from one perspective, in the embodiment shown in FIG. 8, the CM current type DAC 204 is configured to operably determine which of the parameters (1)-(3) that the CM adjustment current Ica is to be correlated with (i.e., adjustment approach) according to a delay relationship between the output signal Vout and the PWM signal Opwm. In other words, in a case when a delay occurs between the output signal Vout and the PWM signal Opwm (i.e., the level state of the output signal Vout is different from the level state of the PWM signal Opwm), the CM adjustment current Ica can be adjusted further according to for example FIG. 8.

Referring to the example shown in FIG. 8, when the level state of the positive sub-signal Voutp of the output signal Vout is different from the level state of the positive sub-signal Opwmp of the PWM signal Opwm (e.g., as shown in FIG. 8, the positive sub-signal Voutp is at the high level state, whereas, the positive sub-signal Opwmp is at the low level state; or, the positive sub-signal Voutp is at the low level state, whereas, the positive sub-signal Opwmp is at the high level state), and/or, when the level state of the negative sub-signal Voutn of the output signal Vout is different from the level state of the negative sub-signal Opwmn of the PWM signal Opwm (e.g., as shown in FIG. 8, the negative sub-signal Voutn is at the high level state, whereas, negative sub-signal Opwmn is at the low level state; or, the negative sub-signal Voutn is at the low level state, whereas, the negative sub-signal Opwmn is at the high level state), the CM adjustment current Ica is further positively correlated with a product of the predetermined voltage difference $\Delta V$ multiplied by a predetermined coefficient (e.g., K1~K6). It is noteworthy that, in one embodiment, the predetermined coefficients K1~K6 can determine the degree as to how the waveform indicative of the analog input signal Vii (i.e., Viip or Viin) approximately resembles the waveform indicative of the output signal Vout (i.e., Voutp or Voutn)

Please refer to FIG. 8 in conjugation with FIG. 11. In an AVP mode having QR, the CM adjustment current Ica can adaptively enhance a response speed of the CM voltage Viic of the analog input signal Vii in a non-linear manner according to a product of the predetermined voltage difference $\Delta V$ multiplied by the predetermined coefficient (e.g., K1~K6), so as to remedy the insufficiencies with respect to bandwidth or slew rate of a linear amplifier circuit (for example but not limited to the first amplifier 2034 and the second amplifier 202) in the class-D amplifier circuit. Consequently, the CM voltage Viic of the analog input signal Vii can swiftly reach a settled state. Besides, ripples of the CM voltage Viic of the analog input signal Vii can be reduced, and the requirements of slew rate, bandwidth or current for the second amplifier 202 also can be reduced. In one embodiment, the predetermined coefficient (e.g., K1~K6) can be for example a real number ranging between 0 and 1.

To elaborate in detail, please refer to FIG. 6. When the positive sub-signal Voutp of the output signal Vout is at the high level state (e.g., corresponding to the driving power supply PVDD) and when the negative sub-signal Voutn of the output signal Vout is at the high level state (e.g., corresponding to the driving power supply PVDD), the CM adjustment current Ica is a quotient of "the difference of the CM voltage Viic of the analog input signal Vii minus the driving power supply PVDD" divided by "the resistance Rf of the feedback device 2033" (i.e., (Viic-PVDD)/Rf). It is worthwhile noting that, under such situation, the CM adjustment current Ica is a net inflow from the analog input node 205.

Please still refer to FIG. 6. When the positive sub-signal Voutp of the output signal Vout is at the high level state (e.g., corresponding to the driving power supply PVDD) and when the negative sub-signal Voutn of the output signal Vout is at the low level state (e.g., corresponding to zero) or when the positive sub-signal Voutp of the output signal Vout is at the low level state (e.g., corresponding to zero) and when the negative sub-signal Voutn of the output signal Vout is at the high level state (e.g., corresponding to the driving power supply PVDD), the CM adjustment current Ica is a quotient of "the difference of the CM voltage Viic of the analog input signal Vii minus ½ fold of the driving power supply PVDD" divided by "the resistance Rf of the feedback device 2033" (i.e., (Viic-PVDD/2)/Rf). It is worthwhile noting that, under such situation, the CM adjustment current Ica is a net inflow from the analog input node 205. On the other hand, when the positive sub-signal Voutp of the output signal Vout is at the low level state (e.g., corresponding to zero) and when the negative sub-signal Voutn of the output signal Vout is at the low level state (e.g., corresponding to zero), the CM adjustment current Ica is a quotient of the CM voltage Viic of the analog input signal Vii divided by the resistance Rf of the feedback device 2033 (i.e., Viic/Rf). It is worthwhile noting that, under such situation, the CM adjustment current Ica is a net outflow to the analog input node 205.

Please still refer to FIG. 7. When the positive sub-signal Voutp of the output signal Vout is at the high level state (e.g., corresponding to the driving power supply PVDD) and when the negative sub-signal Voutn of the output signal Vout is at the high level state (e.g., corresponding to the driving power supply PVDD), the CM adjustment current Ica is a quotient of "the result of the CM voltage Viic of the analog input signal Vii plus the predetermined voltage difference $\Delta V$ minus the driving power supply PVDD" divided by "the resistance Rf of the feedback device 2033" (i.e., (Viic+$\Delta V$−PVDD)/Rf). It is worthwhile noting that, under such situation, the CM adjustment current Ica is a net inflow from the analog input node 205. When the positive sub-signal Voutp of the output signal Vout is at the high level state (e.g., corresponding to the driving power supply PVDD) and when the negative sub-signal Voutn of the output signal Vout is at the low level state (e.g., corresponding to zero) or when the positive sub-signal Voutp of the output signal Vout is at the low level state (e.g., corresponding to zero) and when the negative sub-signal Voutn of the output signal Vout is at the high level state (e.g., corresponding to the driving power supply PVDD), the CM adjustment current Ica is a quotient of "the difference of the CM voltage Viic of the analog input signal Vii minus ½ fold of the driving power supply PVDD" divided by "the resistance Rf of the feedback device 2033" (i.e., (Viic−PVDD/2)/Rf). It is worthwhile noting that, under such situation, the CM adjustment current Ica is a net inflow from the analog input node 205. On the other hand, when the positive sub-signal Voutp of the output signal Vout is at the low level state (e.g., corresponding to zero) and when the negative sub-signal Voutn of the output signal Vout is at the low level state (e.g., corresponding to zero), the CM adjustment current Ica is a quotient of "the sum of the CM voltage Viic of the analog input signal Vii plus predetermined voltage difference $\Delta V$" divided by the resistance Rf of the feedback device 2033 (i.e., (Viic+$\Delta V$)/Rf). It is worthwhile noting that, under such situation, the CM adjustment current Ica is a net outflow to the analog input node 205.

Please still refer to FIG. 8. When the positive sub-signal Opwmp of the PWM signal Opwm is at the high level state (e.g., corresponding to the signal power supply VDD) and when the negative sub-signal Opwmn of the PWM signal Opwm is at the high level state (e.g., corresponding to the signal power supply VDD), (1) when the positive sub-signal Voutp of the output signal Vout is at the high level state (e.g., corresponding to the driving power supply PVDD) and when the negative sub-signal Voutn of the output signal Vout is at the high level state (e.g., corresponding to the driving power supply PVDD), the CM adjustment current Ica is a quotient of "the result of the CM voltage Viic of the analog input signal Vii plus the predetermined voltage difference $\Delta V$ minus the driving power supply PVDD" divided by "the resistance Rf of the feedback device 2033" (i.e., (Viic+$\Delta V$−PVDD)/Rf). It is worthwhile noting that, under such situation, the CM adjustment current Ica is a net inflow from the analog input node 205; (2) when the positive sub-signal Voutp of the output signal Vout is at the high level state (e.g., corresponding to the driving power supply PVDD) and when the negative sub-signal Voutn of the output signal Vout is at the low level state (e.g., corresponding to zero) or when the positive sub-signal Voutp of the output signal Vout is at the low level state (e.g., corresponding to zero) and when the negative sub-signal Voutn of the output signal Vout is at the high level state (e.g., corresponding to the driving power supply PVDD), the CM adjustment current Ica is a quotient of "the result of the CM voltage Viic of the analog input signal Vii plus the product of the first coefficient K1 multiplied by the predetermined voltage difference $\Delta V$ minus ½ fold of the driving power supply PVDD" divided by "the resistance Rf of the feedback device 2033" (i.e., (Viic+K1*$\Delta V$−PVDD/2)/Rf). It is worthwhile noting that, under such situation, the CM adjustment current Ica is a net inflow from the analog input node 205; or (3) when the positive sub-signal Voutp of the output signal Vout is at the low level state (e.g., corresponding to zero) and when the negative sub-signal Voutn of the output signal Vout is at the low level state (e.g., corresponding to zero), the CM adjustment current Ica is a quotient of "the sum of the CM voltage Viic of the analog input signal Vii plus the product of the second coefficient K2 multiplied by the predetermined voltage difference $\Delta V$" divided by the resistance Rf of the feedback device 2033 (i.e., (Viic+K2*$\Delta V$)/Rf). It is worthwhile noting that, under such situation, the CM adjustment current Ica is a net outflow to the analog input node 205. In one embodiment, each of the first coefficient K1 and the second coefficient K2 is a real number ranging between 0 and 1.

Please still refer to FIG. 8. When the positive sub-signal Opwmp of the PWM signal Opwm is at the high level state (e.g., corresponding to the signal power supply VDD) and when the negative sub-signal Opwmn of the PWM signal Opwm is at the low level state (e.g., corresponding to zero) or when the positive sub-signal Opwmp of the PWM signal Opwm is at the low level state (e.g., corresponding to zero) and when the negative sub-signal Opwmn of the PWM signal Opwm is at the high level state (e.g., corresponding to the signal power supply VDD), (1) when the positive sub-signal Voutp of the output signal Vout is at the high level state (e.g., corresponding to the driving power supply PVDD) and when the negative sub-signal Voutn of the output signal Vout is at the high level state (e.g., corresponding to the driving power supply PVDD), the CM adjustment current Ica is a quotient of "the result of the CM voltage Viic of the analog input signal Vii plus the product of the third coefficient K3 multiplied by the predetermined voltage difference $\Delta V$ minus the driving power supply PVDD" divided by "the resistance Rf of the feedback device 2033" (i.e., (Viic+K3*$\Delta V$−PVDD)/Rf). It is worthwhile noting that, under such situation, the CM adjustment current Ica is a net inflow from the analog input node 205; (2) when the level state of the positive sub-signal Voutp of the output signal Vout is the same as the level state of the positive sub-signal Opwmp of the PWM signal Opwm and when the level state of the negative sub-signal Voutn of the output signal Vout is the same as the level state of the negative sub-signal Opwmn of the PWM signal Opwm and when the level state of the positive sub-signal Voutp of the output signal Vout is different from the level state of the negative sub-signal Voutn of the output signal Vout, the CM adjustment current Ica is a quotient of "the difference of the CM voltage Viic of the analog input signal Vii minus ½ fold of the driving power supply PVDD" divided by "the resistance Rf of the feedback device 2033" (i.e., (Viic-PVDD/2)/Rf). It is worthwhile noting that, under such situation, the CM adjustment current Ica is a net inflow from the analog input node 205; (3) when the positive sub-signal Voutp of the output signal Vout is at the low level state (e.g., corresponding to zero) and when the negative sub-signal Voutn of the output signal Vout is at the low level state (e.g., corresponding to zero), the CM adjustment current Ica is a quotient of "the sum of the CM voltage Viic of the analog input signal Vii plus the product of the fourth coefficient K4 multiplied by the predetermined voltage difference $\Delta V$" divided by the resistance Rf of the feedback device 2033 (i.e., (Viic+K4*$\Delta V$)/Rf). It is worthwhile noting that, under such situation, the CM adjustment current Ica is a net outflow to the analog input node 205. In one embodiment, each of the third coefficient K3 and the fourth coefficient K4 is a real number ranging between 0 and 1.

Please still refer to FIG. 8. When the positive sub-signal Opwmp of the PWM signal Opwm is at the low level state (e.g., corresponding to zero) and when the negative sub-signal Opwmn of the PWM signal Opwm is at the low level state (e.g., corresponding to zero), (1) when the positive sub-signal Voutp of the output signal Vout is at the high level state (e.g., corresponding to the driving power supply PVDD) and when the negative sub-signal Voutn of the output signal Vout is at the high level state (e.g., corresponding to the driving power supply PVDD), the CM adjustment current Ica is a quotient of "the result of the CM voltage Viic of the analog input signal Vii plus the product of the fifth coefficient K5 multiplied by the predetermined voltage difference $\Delta V$ minus the driving power supply PVDD" divided by "the resistance Rf of the feedback device 2033" (i.e., (Viic+K3*$\Delta V$−PVDD)/Rf). It is worthwhile noting that, under such situation, the CM adjustment current Ica is a net inflow from the analog input node 205; (2) when the positive sub-signal Voutp of the output signal Vout is at the high level state (e.g., corresponding to the driving power supply PVDD) and when the negative sub-signal Voutn of the output signal Vout is at the low level state (e.g., corresponding to zero) or when the positive sub-signal Voutp of the output signal Vout is at the low level state (e.g., corresponding to zero) and when the negative sub-signal Voutn of the output signal Vout is at the high level state (e.g., corresponding to the driving power supply PVDD), the CM adjustment current Ica is a quotient of "the difference of the CM voltage Viic of the analog input signal Vii plus the product of the sixth coefficient K6 multiplied by the predetermined voltage difference $\Delta V$ minus ½ fold of the driving power supply PVDD" divided by "the resistance Rf of the feedback device 2033" (i.e., (Viic+K6*$\Delta V$−PVDD/2)/Rf). It is worthwhile noting that, under such situation, the CM adjustment current Ica is a net inflow from the analog input node 205; or (3) when the positive sub-signal Voutp of the output signal Vout is at the low level state (e.g., corresponding to zero) and when the negative sub-signal Voutn of the output signal Vout is at the low level state (e.g., corresponding to zero), the CM adjustment current Ica is a quotient of "the sum of the CM voltage Viic of the analog input signal Vii plus the predetermined voltage difference ΔV" divided by the resistance Rf of the feedback device 2033 (i.e., (Viic+ΔV)/Rf). It is worthwhile noting that, under such situation, the CM adjustment current Ica is a net outflow to the analog input node 205. In one embodiment, each of the fifth coefficient K5 and the sixth coefficient K6 is a real number ranging between 0 and 1.

Figure 12:
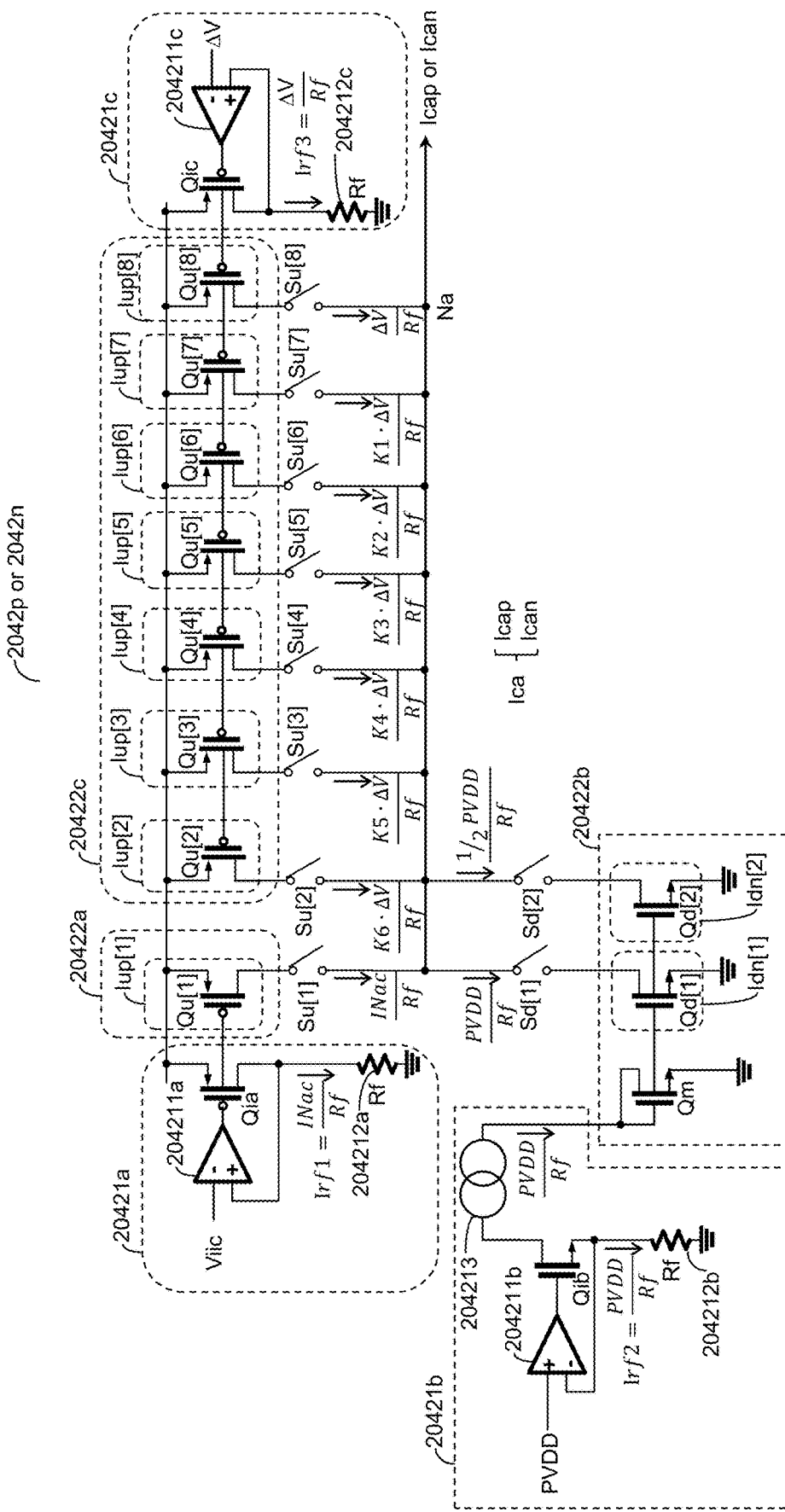
FIG. 12 shows a schematic circuit diagram of a current determination circuit according to an embodiment of the present invention.

Please refer to FIG. 12, which shows a schematic circuit diagram of a current determination circuit according to an embodiment of the present invention. Please refer to FIG. 12. The current determination circuit (i.e., current determination circuit 2042p or current determination circuit 2042n) includes: voltage-to-current conversion circuits 20421a, 20421b and 20421c and current mirrors 20422a, 20422b and 20422c. The voltage-to-current conversion circuit 20421a is configured to operably convert the CM voltage Viic of the analog input signal Vii to a reference current Irf1. The voltage-to-current conversion circuit 20421b is configured to operably convert the driving power PVDD to a reference current Irf2. The voltage-to-current conversion circuit 20421b is configured to operably convert the predetermined voltage difference ΔV to a reference current Irf3. In one embodiment, the predetermined voltage difference ΔV is correlated with an amplitude of the output signal Vout, a slope of the output signal Vout and the resistance Rf of the feedback device 2033. The above-mentioned CM adjustment current Ica described in the embodiments of FIG. 6 to FIG. 8 can be obtained through proper combinations of the above-mentioned reference currents Irf1~Irf3 with an appropriate ratio, which will be described in detail later.

As shown in FIG. 12, in one embodiment, the voltage-to-current conversion circuit 20421a includes: an error amplifier 204211a, a resistor 204212a and a conversion transistor Qia. The voltage-to-current conversion circuit 20421b includes: an error amplifier 204211b, a resistor 204212b and a conversion transistor Qib. The voltage-to-current conversion circuit 20421c includes: an error amplifier 204211c, a resistor 204212c and a conversion transistor Qic. Output ends of the error amplifier 204211a, the error amplifier 204211b and the error amplifier 204211c are coupled to gates of the conversion transistor Qia, the conversion transistor Qib and the conversion transistor Qic, respectively. A drain of the conversion transistor Qia and a non-inverse end of the error amplifier 204211a are commonly coupled to one end of the resistor 204212a. A source of the conversion transistor Qib and an inverse end of the error amplifier 204211b are commonly coupled to one end of the resistor 204212b. A drain of the conversion transistor Qic and a non-inverse end of the error amplifier 204211c are commonly coupled to one end of the resistor 204212c. Another end of the resistor 204212a, another end of the resistor 204212b and another end of the resistor 204212c are coupled to a ground voltage level.

By the feedback loops involving the error amplifier 204211a, the error amplifier 204211b and the error amplifier 204211c, the inverse end and the non-inverse end of the error amplifier 204211a, the inverse end and the non-inverse end of the error amplifier 204211b and the inverse end and the non-inverse end of the error amplifier 204211c are locked to the same voltages, which are the CM voltage Viic, the driving power supply PVDD and the predetermined voltage difference ΔV, respectively, so as to generate the reference current Irf1, the reference current Irf2 and the reference current Irf3 correspondingly. In one embodiment, the reference current Irf1 is equal to a quotient of the CM voltage Viic divided by a resistance Rf of the resistor 204212a. The reference current Irf2 is equal to a quotient of the driving power supply PVDD divided by a resistance Rf of the resistor 204212b. The reference current Irf3 is equal to a quotient of the predetermined voltage difference ΔV divided by a resistance Rf of the resistor 204212c.

In one embodiment, the current mirrors 20422a, 20422b and 20422c can mirror the reference current Irf1, the reference current Irf2 and the reference current Irf3 to generate intermediate current sources Iup[1], Idn[1]~Idn[2] and Iup[2]~Iup[8], respectively. In one embodiment, each of the current mirrors 20422a, 20422b and 20422c includes one mirror transistor or plural mirror transistors. For example, the current mirror 20422a includes one mirror transistor Qu[1], whereas, the current mirror 20422b includes mirror transistors Qm and Qd[1]~Qd[2], whereas, the current mirror 20422c includes mirror transistors Qu[2]~Qu[8].

The source of the mirror transistor Qu[1] and the source of the conversion transistor Qia of the voltage-to-current conversion circuit 20421a are commonly coupled to a node. The gate of the mirror transistor Qu[1] is coupled to the gate of the conversion transistor Qia. In addition, the mirror transistor Qu[1] has a same aspect ratio as the conversion transistor Qia, so that a current flowing out from the drain of the mirror transistor Qu[1] is equal to the reference current Irf1, thus generating the intermediate current source Iup[1]. The source of the mirror transistor Qu[8] and the source of the conversion transistor Qic of the voltage-to-current conversion circuit 20421c are commonly coupled to a node. The gate of the mirror transistor Qu[8] is coupled to the gate of the conversion transistor Qic. In addition, the mirror transistor Qu[8] has a same aspect ratio as the conversion transistor Qic, so that a current flowing out from the drain of the mirror transistor Qu[8] is equal to the reference current Irf3, thus generating the intermediate current source Iup[8].

The source of the mirror transistor Qd[1] and the source of the mirror transistor Qm are commonly coupled to the ground voltage level. The gate of the mirror transistor Qd[1] is coupled to the gate of the mirror transistor Qm. In addition, the mirror transistor Qd[1] has a same aspect ratio as the mirror transistor Qm, so that the current flowing out from the drain of the mirror transistor Qd[1] is equal to the reference current Irf2, thus generating the intermediate current source Idn[1], wherein the reference current Irf2 is obtained from the mirror transistor Qm which duplicates the current from the conversion transistor Qib by the current mirror 204213. Similarly, the mirror transistors Qd[2] and Qu[2]~Qu[7] can generate intermediate current sources Idn[2] and Iup[2]~Iup[7], respectively, through adopting the same mechanism. The aspect ratios of the mirror transistors Qd[2] and Qu[2]~Qu[7] can be designed to be proportional to the aspect ratios of the mirror transistors Qd[1] and Qu[8], so that the current level of the intermediate current source Idn[2] is equal to ½-fold of the current level of the intermediate current source Idn[1] and so that current levels of the intermediate current sources Iup[2]~Iup[7] are K6-fold of the current level of the intermediate current source Iup[8], K5-fold of the current level of the intermediate current source Iup[8], K4-fold of the current level of the intermediate current source Iup[8], K3-fold of the current level of the intermediate current source Iup[8], K2-fold of the current level of the intermediate current source Iup[8] and K1-fold of the current level of the intermediate current source Iup[8], respectively.

The intermediate current sources Iup[1], Idn[1]~Idn[2] and Iup[2]~Iup[8] are commonly coupled to the node Na via adjustment switches Su[1], Sd[1]~Sd[2] and Su[2]~Su[8], respectively. The adjustment switches Su[1], Sd[1]~Sd[2]

and Su[2]~Su[8] operate to switch the intermediate current sources Iup[1]~Iup[8] and Idn[1]~Idn[2], respectively, thereby generating the CM adjustment current Ica according to the requirements in FIG. 6 to FIG. 8. It is worthwhile noting that, in an embodiment corresponding to FIG. 6, the circuits (20421c and 20422c) relevant to the predetermined voltage difference ΔV can be omitted in FIG. 12.

The present invention has provided a class-D amplifying system as described above. Advantages of the present invention include: that by employing an input current type DAC 201, the present invention can omit the use of the second amplifier 202, whereby noises are reduced; and that in a case when an output signal is zero, the CM current type DAC 204 of the present invention can be disabled to further reduce noises. Other advantages of the present invention include: that the CM adjustment current generated by the common mode current type DAC 204 of the present invention can enhance the response speed of the CM voltage Viic of the analog input signal Vii in a non-linear manner, to compensate the insufficiency of bandwidth or slew rate of a linear amplifier circuit (for example but not limited to the first amplifier 2034 and the second amplifier 202) of a class-D amplifier circuit; and that the present invention can lower the requirements of slew rate, bandwidth or current for the second amplifier 202.

From one perspective, in one embodiment, the CM current type DAC 204 can be integrated into the class-D amplifier circuit.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A class-D amplifying system, comprising:
   an input current type digital-to-analog converter (DAC), which is configured to operably convert a digital input signal, so as to generate an analog input signal at an analog input node;
   a class-D amplifier circuit, which is coupled to the input current type DAC, wherein the class-D amplifier circuit includes:

a pulse width modulator, which is configured to operably generate a pulse width modulation (PWM) signal according to the analog input signal;
   an H-bridge (full-bridge) power stage circuit, which is configured to operably generate an output signal according to the PWM signal, wherein the H-bridge power stage circuit is powered by a driving power supply; and
   a feedback device, which is configured to operably feedback the output signal to the analog input node; and
   a common mode (CM) current type digital-to-analog converter (DAC), which is coupled to the analog input node and which is configured to operably generate a CM adjustment current, wherein the CM adjustment current is correlated with one of the following parameters:
   (1) a CM voltage of the analog input signal;
   (2) the driving power supply; or
   (3) the CM voltage of the analog input signal and the driving power supply;
   wherein the CM current type DAC is configured to operably determine which of the parameters (1)-(3) that the CM adjustment current is to be correlated with according to one of the following states:
   (A) a level state of the output signal;
   (B) a level state of the PWM signal; or
   (C) the level state of the output signal and the level state of the PWM signal;
   wherein in an adaptive voltage position mode, the CM adjustment current is further correlated with a predetermined voltage difference, wherein the predetermined voltage difference is correlated with an amplitude of the output signal, a slope of the output signal and a resistance of the feedback device, wherein in the adaptive voltage position mode, a target value of the CM voltage of the analog input signal is synchronous with and correlated with a CM voltage of the output signal.

2. The class-D amplifying system of claim 1, wherein the class-D amplifier circuit further includes:
   a first amplifier, which is coupled between the pulse width modulator and the analog input node and which is configured to operably buffer and amplify the analog input signal.

3. The class-D amplifying system of claim 2, wherein the class-D amplifier circuit further includes:
   a second amplifier, which is coupled between the analog input node and an input end of the first amplifier, wherein the second amplifier is configured to operably control the CM voltage of the analog input signal by pseudo-grounding.

4. The class-D amplifying system of claim 1, wherein in a case when the CM adjustment current is correlated with the parameter (1) or the parameter (3), the CM adjustment current is positively correlated with the analog input signal.

5. The class-D amplifying system of claim 4, wherein in a case when the state (A) or the state (C) is in presence, when the output signal is at a high level state, the CM adjustment current is negatively correlated with the driving power supply.

6. The class-D amplifying system of claim 4, wherein the output signal includes a signal pair including a positive sub-signal and a negative sub-signal, and wherein in a case when the state (A) or the state (C) is in presence, when a level state of the positive sub-signal of the output signal is different from a level state of the negative sub-signal of the output signal, the CM adjustment current is negatively correlated with ½-fold of the driving power supply.

7. The class-D amplifying system of claim 4, wherein in the adaptive voltage position mode, the CM adjustment current is further positively correlated with the predetermined voltage difference.

8. The class-D amplifying system of claim 7, wherein the output signal includes a signal pair including a positive sub-signal and a negative sub-signal, and wherein in the adaptive voltage position mode and in a case when the state (A) is in presence, when a level state of the positive sub-signal of the output signal is the same as a level state of the negative sub-signal of the output signal, the CM adjustment current is further positively correlated with the predetermined voltage difference.

9. The class-D amplifying system of claim 8, wherein the output signal includes a signal pair including a positive sub-signal and a negative sub-signal and the PWM signal includes a signal pair including a positive sub-signal and a negative sub-signal, and wherein in the adaptive voltage position mode and in a rapid response mode, in a case when the state (C) is in presence, when a level state of the positive sub-signal of the output signal is different from a level state of the positive sub-signal of the PWM signal and/or when a level state of the negative sub-signal of the output signal is different from a level state of the negative sub-signal of the PWM signal, the CM adjustment current is further positively correlated with a product of a predetermined voltage difference multiplied by a predetermined coefficient.

10. The class-D amplifying system of claim 9, wherein the predetermined coefficient is a real number ranging between 0 and 1.

11. The class-D amplifying system of claim 1, wherein the CM adjustment current is negatively correlated with a resistance of the feedback device.

12. The class-D amplifying system of claim 4, wherein the CM adjustment current is negatively correlated with a resistance of the feedback device.

13. The class-D amplifying system of claim 1, wherein the CM current type DAC includes:
   a decoder, which is configured to operably execute a decoding operation according to the PWM signal and a clamped output signal, so as to generate a switch control signal, wherein the clamped output signal is obtained by clamping the output signal; and
   a current determination circuit having a plurality of intermediate current sources and a plurality of adjustment switches, wherein the switch control signal is configured to operably control the plurality of adjustment switches, so as to switch the plurality of intermediate current sources, thus generating the CM adjustment current.

14. The class-D amplifying system of claim 13, wherein the CM current type DAC further includes:
   a voltage clamper, which is configured to operably clamp the output signal, to generate the clamped output signal.

15. The class-D amplifying system of claim 14, wherein the voltage clamper includes:
   a clamp transistor, which is configured to operably generate an intermediate signal according to the output signal and a signal power supply; and
   a buffer, which is configured to operably generate the clamped output signal according to the intermediate signal, wherein the signal power supply provides power to the buffer.

16. The class-D amplifying system of claim 13, wherein the current determination circuit includes:

at least one voltage-to-current conversion circuit, which is configured to operably convert the CM voltage of the analog input signal or convert the driving power to at least one reference current; and
   a plurality of current mirrors, which is configured to operably generate the plurality of intermediate current sources according to the at least one reference current.

17. The class-D amplifying system of claim 1, wherein in a case when the output signal is zero, the CM current type DAC is disabled, so as to reduce noise.

18. The class-D amplifying system of claim 1, wherein in a case when the state (C) is in presence, the CM current type DAC is configured to operably determine which of the parameters (1)-(3) that the CM adjustment current is to be correlated with according to a delay relationship between the output signal and the PWM signal.

19. A class-D amplifier circuit, which is configured to operably receive an analog input signal from an analog input node, and to operably convert the analog input signal, thus generating an output signal; the class-D amplifying system comprising:
   a pulse width modulator, which is configured to operably generate a pulse width modulation (PWM) signal according to the analog input signal;
   an H-bridge (full-bridge) power stage circuit, which is configured to operably generate an output signal according to the PWM signal, wherein the H-bridge power stage circuit is powered by a driving power supply;
   a feedback device, which is configured to operably feedback the output signal to the analog input node; and
   a common mode (CM) current type digital-to-analog converter (DAC), which is coupled to the analog input node and which is configured to operably generate a CM adjustment current, wherein the CM adjustment current is correlated with one of the following parameters:
   (1) a CM voltage of the analog input signal;
   (2) the driving power supply; or
   (3) the CM voltage of the analog input signal and the driving power supply;
   wherein the CM current type DAC is configured to operably determine which of the parameters (1)-(3) that the CM adjustment current is to be correlated with according to one of the following states:
   (A) a level state of the output signal;
   (B) a level state of the PWM signal; or
   (C) the level state of the output signal and the level state of the PWM signal;
   wherein in an adaptive voltage position mode, the CM adjustment current is further correlated with a predetermined voltage difference, wherein the predetermined voltage difference is correlated with an amplitude of the output signal, a slope of the output signal and a resistance of the feedback device, wherein in the adaptive voltage position mode, a target value of the CM voltage of the analog input signal is synchronous with and correlated with a CM voltage of the output signal.

20. The class-D amplifier circuit of claim 19, wherein the class-D amplifier circuit further includes:
   a first amplifier, which is coupled between the pulse width modulator and the analog input node and which is configured to operably buffer and amplify the analog input signal.

21. The class-D amplifier circuit of claim 20, wherein the class-D amplifier circuit further includes:

a second amplifier, which is coupled between the analog input node and an input end of the first amplifier, wherein the second amplifier is configured to operably control the CM voltage of the analog input signal by pseudo-grounding.

22. The class-D amplifier circuit of claim 19, wherein in a case when the CM adjustment current is correlated with the parameter (1) or the parameter (3), the CM adjustment current is positively correlated with the analog input signal.

23. The class-D amplifier circuit of claim 22, wherein in a case when the state (A) or the state (C) is in presence, when the output signal is at a high level state, the CM adjustment current is negatively correlated with the driving power supply.

24. The class-D amplifier circuit of claim 22, wherein the output signal includes a signal pair including a positive sub-signal and a negative sub-signal, and wherein in a case when the state (A) or the state (C) is in presence, when a level state of the positive sub-signal of the output signal is different from a level state of the negative sub-signal of the output signal, the CM adjustment current is negatively correlated with ½-fold of the driving power supply.

25. The class-D amplifier circuit of claim 22, wherein in the adaptive voltage position mode, the CM adjustment current is further positively correlated with the predetermined voltage difference.

26. The class-D amplifier circuit of claim 25, the output signal includes a signal pair including a positive sub-signal and a negative sub-signal, and wherein in the adaptive voltage position mode and in a case when the state (A) is in presence, when a level state of the positive sub-signal of the output signal is the same as a level state of the negative sub-signal of the output signal, the CM adjustment current is further positively correlated with the predetermined voltage difference.

27. The class-D amplifier circuit of claim 26, wherein the output signal includes a signal pair including a positive sub-signal and a negative sub-signal and the PWM signal includes a signal pair including a positive sub-signal and a negative sub-signal, and wherein in the adaptive voltage position mode and in a rapid response mode, in a case when the state (C) is in presence, when a level state of the positive sub-signal of the output signal is different from a level state of the positive sub-signal of the PWM signal and/or when a level state of the negative sub-signal of the output signal is different from a level state of the negative sub-signal of the PWM signal, the CM adjustment current is further positively correlated with a product of a predetermined voltage difference multiplied by a predetermined coefficient.

28. The class-D amplifier circuit of claim 27, wherein the predetermined coefficient is a real number ranging between 0 and 1.

29. The class-D amplifier circuit of claim 19, wherein the CM adjustment current is negatively correlated with a resistance of the feedback device.

30. The class-D amplifier circuit of claim 22, wherein the CM adjustment current is negatively correlated with a resistance of the feedback device.

31. The class-D amplifier circuit of claim 19, wherein the CM current type DAC includes:
 a decoder, which is configured to operably execute a decoding operation according to the PWM signal and a clamped output signal, so as to generate a switch control signal, wherein the clamped output signal is obtained by clamping the output signal; and
 a current determination circuit having a plurality of intermediate current sources and a plurality of adjustment switches, wherein the switch control signal is configured to operably control the plurality of adjustment switches, so as to switch the plurality of intermediate current sources, thus generating the CM adjustment current.

32. The class-D amplifier circuit of claim 31, wherein the CM current type DAC further includes:
 a voltage clamper, which is configured to operably clamp the output signal, to generate the clamped output signal.

33. The class-D amplifier circuit of claim 32, wherein the voltage clamper includes:
 a clamp transistor, which is configured to operably generate an intermediate signal according to the output signal and a signal power supply; and
 a buffer, which is configured to operably generate the clamped output signal according to the intermediate signal, wherein the signal power supply provides power to the buffer.

34. The class-D amplifier circuit of claim 31, wherein the current determination circuit includes:
 at least one voltage-to-current conversion circuit, which is configured to operably convert the CM voltage of the analog input signal or convert the driving power to at least one reference current; and
 a plurality of current mirrors, which is configured to operably generate the plurality of intermediate current sources according to the at least one reference current.

35. The class-D amplifier circuit of claim 19, wherein in a case when the output signal is zero, the CM current type DAC is disabled, so as to reduce noise.

36. The class-D amplifier circuit of claim 19, wherein in a case when the state (C) is in presence, the CM current type DAC is configured to operably determine which of the parameters (1)-(3) that the CM adjustment current is to be correlated with according to a delay relationship between the output signal and the PWM signal.

* * * * *